(12) United States Patent
Chan et al.

(10) Patent No.: US 11,862,452 B2
(45) Date of Patent: Jan. 2, 2024

(54) CONTACT ISOLATION IN SEMICONDUCTOR DEVICES

(71) Applicant: IMEC VZW, Leuven (BE)

(72) Inventors: Boon Teik Chan, Wilsele (BE); Waikin Li, Leuven (BE); Zheng Tao, Heverlee (BE)

(73) Assignee: IMEC VZW, Leuven (BE)

( * ) Notice: Subject to any disclaimer, the term of this patent is extended or adjusted under 35 U.S.C. 154(b) by 85 days.

(21) Appl. No.: 17/006,642

(22) Filed: Aug. 28, 2020

(65) Prior Publication Data

US 2021/0066116 A1 Mar. 4, 2021

(30) Foreign Application Priority Data

Aug. 30, 2019 (EP) ..................... 19194719

(51) Int. Cl.
*H01L 21/762* (2006.01)
*H01L 27/092* (2006.01)
(Continued)

(52) U.S. Cl.
CPC .. *H01L 21/76224* (2013.01); *H01L 21/02175* (2013.01); *H01L 21/76834* (2013.01); *H01L 21/8221* (2013.01); *H01L 21/823807* (2013.01); *H01L 21/823814* (2013.01); *H01L 21/823871* (2013.01); *H01L 27/092* (2013.01); *H01L 29/0653* (2013.01); *H01L 29/1079* (2013.01); *H01L 29/775* (2013.01)

(58) Field of Classification Search
CPC ......... H01L 21/02175; H01L 21/76834; H01L 21/76224; H01L 21/823807; H01L 27/092; H01L 27/0688; H01L 21/8221; H01L 21/823814; H01L 21/823871; H01L 21/823878; H01L 29/0653; H01L 29/775; H01L 29/1079; H01L 29/66439; H01L 29/0673

See application file for complete search history.

(56) References Cited

U.S. PATENT DOCUMENTS 9,576,858 B2 2/2017 Cheng et al.
9,659,963 B2 5/2017 Cheng et al.
(Continued)

FOREIGN PATENT DOCUMENTS

WO 2017111866 A1 6/2017
WO 2018118089 A1 6/2018
(Continued)

OTHER PUBLICATIONS

Extended European Search Report and Written Opinion, EP Application No. 19194719.1, dated Mar. 9, 2020, 8 pages.
(Continued)

*Primary Examiner* — Michael M Trinh
(74) *Attorney, Agent, or Firm* — McDonnell Boehnen Hulbert & Berghoff LLP

(57) ABSTRACT

In a first aspect, the present disclosure relates to a method for forming a contact isolation for a semiconductor device, comprising: providing a semiconductor structure comprising a trench exposing a contact thereunder, filling a bottom of the trench with a sacrificial material, infiltrating the sacrificial material with a ceramic material, and removing the sacrificial material.

19 Claims, 2 Drawing Sheets

(51) Int. Cl.

| | |
|---|---|
| *H01L 21/8238* | (2006.01) |
| *H01L 29/06* | (2006.01) |
| *H01L 21/02* | (2006.01) |
| *H01L 29/775* | (2006.01) |
| *H01L 21/822* | (2006.01) |
| *H01L 29/10* | (2006.01) |
| *H01L 21/768* | (2006.01) |

(56) References Cited

U.S. PATENT DOCUMENTS

| | | | |
|---|---|---|---|
| 9,837,414 B1 | 12/2017 | Balakrishnan et al. | |
| 10,079,145 B2* | 9/2018 | Chan | H01L 21/47 |
| 10,256,158 B1 | 4/2019 | Frougier et al. | |
| 2016/0300756 A1* | 10/2016 | Somervell | H01L 21/02164 |
| 2017/0117144 A1* | 4/2017 | Kalutarage | H01L 21/02321 |
| 2018/0173109 A1* | 6/2018 | Gronheid | G03F 7/0002 |
| 2021/0017649 A1* | 1/2021 | Martinson | C08L 33/12 |

FOREIGN PATENT DOCUMENTS

| | | |
|---|---|---|
| WO | 2019005000 A1 | 1/2019 |
| WO | WO-2019005000 A1 * | 1/2019 |

OTHER PUBLICATIONS

Cianci, Elena, Daniele Nazzari, Gabriele Seguini, and Michele Perego. "Trimethylaluminum diffusion in PMMA thin films during sequential infiltration synthesis: In situ dynamic spectroscopic ellipsometric investigation." Advanced Materials Interfaces 5, No. 20 (2018): 1801016.

Chan, Philip CH, Xusheng Wu, Chuguang Feng, Mansun Chan, and Shengdong Zhang. "Three-dimensional stacked-Fin-CMOS integrated circuit using double layer SOI material." In Proceedings. 7th International Conference on Solid-State and Integrated Circuits Technology, 2004., vol. 1, pp. 81-85. IEEE, 2004.

Vincent, Ph.D, Benjamin. "Practical Methods to Overcome the Challenges of 3D Logic Design." Coventor, A Lam Research Company Blog, posted on Jun. 22, 2018. https://www.coventor.com/blog/practical-methods-to-overcome-the-challenges-of-3d-logic-design/, downloaded on Apr. 16, 2019. 5 pages.

Wu, Xusheng, Philip CH Chan, Shengdong Zhang, Chuguang Feng, and M. A. N. S. U. N. Chan. "Stacked 3-D fin-CMOS technology." IEEE electron device letters 26, No. 6 (2005): 416-418.

Schuddinck et al., "The Complementary FET (CFET) for CMOS scaling beyond N3", IEEE Symposium on VLSI Technology, 2018, 141-142.

* cited by examiner

CONTACT ISOLATION IN SEMICONDUCTOR DEVICES

CROSS-REFERENCE TO RELATED APPLICATIONS

The present application is a non-provisional patent application claiming priority to European Patent Application No. EP 19194719.1, filed Aug. 30, 2019, the contents of which are hereby incorporated by reference.

FIELD OF THE DISCLOSURE

The present disclosure relates to the provision of contact isolation during semiconductor processing and more particularly to such contact isolation suitable for advanced node complementary field-effect transistors.

BACKGROUND

In view of seeking to uphold Moore's law and the associated continuous quest for scaling down, a complementary field-effect transistor (CFET) design has been proposed as a possible contender for the 3 nanometer (nm) technology node and beyond. The CFET can be regarded as a further evolution of the vertically stacked gate-all-around (GAA) nanowire transistor, where, instead of stacking either n-type or p-type devices, it stacks both types on top of each other. Ryckaert et al. for example proposed a CFET flow wherein an n-type vertical sheet is stacked on a p-type fin (RYCKAERT, J., et al. The Complementary FET (CFET) for CMOS scaling beyond N3. In: 2018 IEEE Symposium on VLSI Technology. IEEE, 2018. p. 141-142).

One of the challenges that remain for such CFETs is that of the contact isolation between the bottom and top contact. Indeed, there is also limited vertical space available for the bottom contact and the contact isolation, typically in the order of about 10 nm for each. This limited vertical space also constricts the material choice for the contact isolation so as to still ensure desired isolation properties. For architectures with a so-called contacted gate (poly) pitch (CPP) in the order of 90 nm, the contact isolation can be provided by plasma-enhanced atomic layer deposition (PEALD) of a conformal $Si_3N_4$ liner and PEALD of a $SiO_2$ cover spacer (to protect the $Si_3N_4$ liner during the etch-back thereof). However, for more advanced architectures where the trench width is only about 12-14 nm, the $Si_3N_4$ liner alone would already fill the trench completely, thereby making this approach unsuited.

Further, the conformal $Si_3N_4$ liner's profile reflects that of the underlying contact. Thus, if the contact has a curved profile, which is typically the case, the overlaying $Si_3N_4$ liner will likewise not have a flat top surface.

There is thus still a need in the art for ways of providing a contact isolation, suitable for advanced node complementary field-effect transistors, which address some or all of the issues outlined above.

SUMMARY

Embodiments of the present disclosure provide contact isolation for semiconductor devices. Further, embodiments of the present disclosure provide manufacturing steps associated therewith. This can be accomplished by methods and semiconductor structures according to the present disclosure.

In example embodiments of the present disclosure, the contact isolation and associated manufacturing steps are compatible with advanced technology nodes. Further, in examples of the present disclosure, the contact isolation can be provided in a trench having a width lower than 20 nm.

In example embodiments of the present disclosure, the contact isolation can be relatively thin (e.g., thinner than 10 nm or 20 nm). Further, in example embodiments of the present disclosure, even in view of its relatively thin thickness, a well-performing contact isolation can be achieved.

In example embodiments of the present disclosure, the contact isolation can have a profile which is independent of that of the underlying contact.

In example embodiments of the present disclosure, an etch-back of the sacrificial material can be well controlled.

In example embodiments of the present disclosure, the method is relatively straightforward and economical.

In a first aspect, the present disclosure relates to a method for forming a contact isolation for a semiconductor device, comprising: (a) providing a semiconductor structure comprising a trench exposing a contact thereunder, (b) filling a bottom of the trench with a sacrificial material, (c) infiltrating the sacrificial material with a ceramic material, and (d) removing the sacrificial material.

In a second aspect, the present disclosure relates to a semiconductor structure for forming a contact isolation for a semiconductor device, comprising: (i) a trench, (ii) a contact abutting a bottom of the trench, and (iii) a sacrificial material infiltrated with a ceramic material filling the bottom of the trench.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial novel improvements, including departures from prior practices, resulting in the provision of more efficient, stable and reliable devices of this nature.

The above and other characteristics, features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1A:
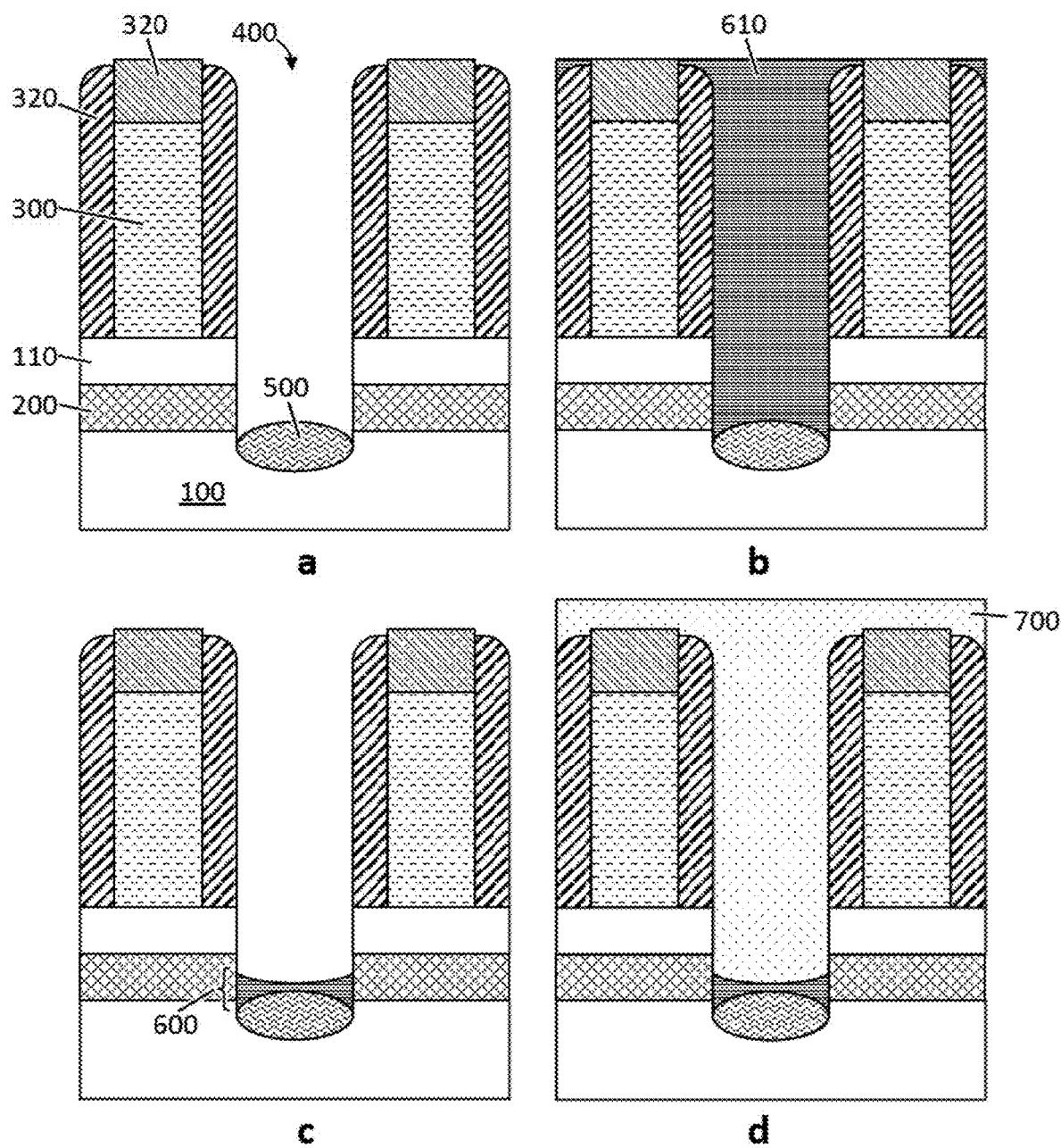
FIG. 1A depicts steps in a process of forming a contact isolation for a semiconductor device in accordance with an example embodiment of the present disclosure.

In the different figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under certain circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable with their antonyms under certain circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Reference will be made to transistors. These are devices having a first main electrode such as a drain, a second main electrode such as a source and a control electrode such as a gate for controlling the flow of electrical charges between the first and second main electrodes.

It will be clear for a person skilled in the art that the present disclosure is also applicable to similar devices that can be configured in any transistor technology, including for example, but not limited thereto, CMOS, BiCMOS, Bipolar and SiGe BiCMOS technology.

The following terms are provided solely to aid in the understanding of the disclosure.

As used herein, and unless otherwise specified, the term "source/drain" is used to refer to "source and/or drain". Likewise, a "source/drain structure" (e.g., a source/drain region) is a "source structure and/or drain structure" (e.g., a source region and/or a drain region).

In a first aspect, the present disclosure relates to a method for forming a contact isolation for a semiconductor device, comprising: (a) providing a semiconductor structure comprising a trench exposing a contact thereunder, (b) filling a bottom of the trench with a sacrificial material, (c) infiltrating the sacrificial material with a ceramic material, and (d) removing the sacrificial material. Upon removing the sacrificial material, the ceramic material remains and forms the contact isolation.

In embodiments, the semiconductor device may be a complementary field-effect transistor. In embodiments, the semiconductor structure may be an intermediate structure for a complementary field-effect transistor. In embodiments, the intermediate structure may comprise a semiconductor substrate (e.g., a Si substrate), an auxiliary region (e.g., a SiGe region) on the semiconductor substrate and a semiconductor region (e.g., a Si region) on the auxiliary region. Such an auxiliary region (e.g., SiGe region) can, for example, may be desirable in that it can be selectively removed (e.g., with respect to the Si region or Si substrate), selectively recessed or selectively oxidized (e.g., to from an inner spacer). This is for example useful in forming a gate-all-around (e.g., in a replacement metal gate module). In embodiments, the semiconductor substrate may be for defining therein a first channel for a CFET. In embodiments, the semiconductor region may be for defining therein a second channel for a CFET. In embodiments, the semiconductor region may be overlaid with one or more gate lines. In embodiments, the gate lines may each be covered with a gate cap (e.g., a $Si_3N_4$ gate cap) and flanked with gate spacers (e.g., a $Si_3N_4$ gate spacers). In embodiments, the trench may separate gate spacers of two adjacent gate lines. In embodiments, the trench may penetrate through the semiconductor region and the auxiliary region.

In embodiments, the contact may comprise a contact liner (e.g., TiN) and a contact metal (e.g., W). The contact can aid in reducing the contact resistance and in interface preparation. In embodiments, the contact may overlay a source/drain region. In embodiments, the source/drain region may be a p-doped epitaxial source/drain region (e.g., a B-doped embedded SiGe).

In embodiments, step b may comprise: (b1) filling the trench with the sacrificial material, and (b2) etching back the sacrificial material. In embodiments, step b2 may comprise an $H_2$/He-based plasma etching. A $H_2$/He-based plasma etching allows to etch the sacrificial material at a relatively low etch rate (e.g., about eight to ten times slower as compared to using a standard $O_2$-based plasma), thereby allowing to well control the etching depth. In embodiments, step b2 may comprise etching back the sacrificial material to a thickness of 30 nm or less, and in some examples 20 nm or less or 10 nm or less (e.g., from 1 to 10 nm).

In embodiments, the sacrificial material may comprise functional groups suitable for coordinating with the first precursor (cf. infra). In embodiments, the sacrificial material may comprise a Lewis basic functional group (e.g., an electron donor for coordinating with a Lewis acid). In embodiments, the Lewis basic functional group may comprise a heteroatom (e.g., 0 or N). In embodiments, the Lewis basic functional group may comprise a carbonyl, ester, amide or amine functionality. In embodiments, the sacrificial material may be a spin-on-carbon (SoC), a poly(methyl methacrylate) (PMMA) or a polyphthalamide (PPA), for example an SoC or a PMMA. One suitable SoC may for example be HM710 from JSR micro.

In embodiments, the ceramic material may be a metal oxide. In embodiments, the ceramic material may be an oxide of Al (e.g., $Al_2O_3$), Hf (e.g., $HfO_2$), Zr (e.g., $ZrO_2$), Ti (e.g., $TiO_x$), Ru (e.g., $RuO_x$) or Si (e.g., $SiO_2$). In embodiments, the ceramic material may have a relative dielectric constant of 15 or less, for example 10 or less or 5 or less. For example, $Al_2O_3$ has relative dielectric constant around 8.5-9.0 and $SiO_2$ around 3.5-4.5; compared to $Si_3N_4$ which is often used as a material for a contact isolation before now and which is around 6.2. According to the present disclosure, any sacrificial material defined herein can be used with any ceramic material defined herein. As non-limiting examples, the sacrificial material can be SoC and the ceramic material can be an oxide of Al (e.g., $Al_2O_3$); the sacrificial material can be a PMMA and the ceramic material can be an oxide of Al (e.g., $Al_2O_3$); the sacrificial material can be SoC and the ceramic material can be an oxide of Si (e.g., $SiO_2$); or the sacrificial material can be PMMA and the ceramic material can be an oxide of Si (e.g., $SiO_2$).

In embodiments, step c may comprise: (c1) exposing the sacrificial material to a first precursor, and (c2) exposing the sacrificial material to a second precursor. The first and second precursor are thus precursors for forming the ceramic material and may in that sense alternatively be referred to respectively as 'first ceramic material precursor' and 'second ceramic material precursor'.

In embodiments, the first precursor may be a Lewis acidic metal compound and wherein the second precursor may be an oxidant. In embodiments, the Lewis acidic metal compound may be selected from $2Al(CH_3)_3$ (trimethylaluminium, TMA), $HfCl_4$, $Zn(C_2H_5)_2$, $TiCl_4$, $SiCl_4$ or ToRuS-blend (e.g., from Air Liquide). In embodiments, the first precursor may coordinate selectively to the sacrificial material with respect to other exposed materials of the semiconductor structure (e.g., the gate cap, gate spacers, and semiconductor region). In embodiments, the oxidant may be $H_2O$ or $O_3$. In embodiments, step c may be performed in a reaction chamber. In embodiments, step c1 may further comprise, after exposing the sacrificial material to the first precursor, purging the reaction chamber with an inert gas (e.g., $N_2$). In embodiments, step c2 may further comprise, after exposing the organic sacrificial material to the first precursor, purging the reaction chamber with an inert gas (e.g., $N_2$).

In embodiments, step c may comprise a sequential infiltration synthesis. In embodiments, a sequence comprising step c1 and step c2 may be performed from 1 to 100 times, for example from 2 to 20 times, or from 3 to 10 times.

In embodiments, the method may comprise a step e, after step c, of: (e) growing a further ceramic material on the ceramic material. In embodiments, step e may be performed before or after step d. In embodiments, the further ceramic material may be $SiO_2$. In embodiments, step e may comprise growing $SiO_2$ on an alkylaluminium seeding layer using an alkoxysilanol (e.g., tris(tert-pentoxy)silanol, TPS; or tris(tert-butoxy)silanol, TBS). In embodiments, the method may comprise in step c infiltrating the sacrificial material with an alkylaluminium (e.g., TMA) and subsequently in step e growing $SiO_2$ on the alkylaluminium using the alkoxysilanol.

In embodiments, step d may comprise removing the sacrificial material selectively with respect to the ceramic material. In embodiments, step d may comprise an $O_2$-based (e.g., $Ar/O_2$) plasma etching. Such an $O_2$-based plasma etching can be desirable in that, for at least some sacrificial materials (e.g., PPA), the effect of the ceramic material shrinking upon removing the sacrificial material (cf. infra) was observed to be more pronounced than when a reducing chemistry such as $N_2/H_2$ is used instead. The thickness in the latter case did also decrease, but to a lesser degree.

It was surprisingly realized within the present disclosure that by infiltrating the sacrificial material with a ceramic material and subsequently removing the sacrificial material, the ceramic material shrinks, yielding a contact isolation with the desired characteristics (e.g., being sufficiently thin). This is especially true if the thickness of the sacrificial material was already relatively thin to begin with, as for example obtainable by etching it back in a relatively slow and controlled fashion (cf. supra). As such, the thickness of the resulting contact isolation can be effectively controlled through the sacrificial material thickness and the amount of ceramic material infiltrated therein (e.g., a number of SIS cycles). Furthermore, the obtained contact isolation also typically has a top profile which is relatively flat and this independently of the top profile of the underlying layers (e.g., the contact and/or source/drain region).

In embodiments, the contact isolation may have a thickness of 20 nm or less, in some examples 10 nm or less, or 5 nm or less.

In embodiments, any feature of any embodiment of the first aspect may independently be as correspondingly described for any embodiment of any of the other aspects.

In a second aspect, the present disclosure relates to a semiconductor structure for forming a contact isolation for a semiconductor device, comprising: (i) a trench, (ii) a contact abutting a bottom of the trench, and (iii) a sacrificial material infiltrated with a ceramic material filling the bottom of the trench.

In embodiments, the semiconductor structure may be obtained after step c of the first aspect.

In embodiments, any feature of any embodiment of the second aspect may independently be as correspondingly described for any embodiment of any of the other aspects.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

Formation of a Contact Isolation for a Semiconductor Device

By way of example, the formation of a contact isolation in accordance with the present disclosure for a complementary field-effect transistor (CFET) is described below with reference to FIG. 1A and FIG. 1B.

We now refer to section a of FIG. 1A. An intermediate structure in the formation of the CFET was provided, comprising a Si wafer 100, a SiGe region 200 on the Si wafer 100 and a Si region 110 on the SiGe region 200; wherein the Si wafer 100 was for defining therein a first channel of the CFET and the Si region 110 was for defining therein a second channel of the CFET. The Si region 110 was overlaid with gate lines 300, each covered with a $Si_3N_4$ gate cap 310 and flanked with $Si_3N_4$ gate spacers 320. A trench 400 separated two adjacent gate lines' gate spacers 320 and penetrated through the Si region 110 and the SiGe region 200, exposing a B-doped embedded SiGe (eSiGe:B) p-doped epitaxial source/drain region 500, for the first channel, grown on the Si wafer 100.

We now refer to section b of FIG. 1A. The trench 400 was covered with a TiN contact liner (not depicted) and overfilled with W contact metal 610, followed by a planarization step (e.g., a chemical-mechanical planarization) stopping on the gate cap 310.

We now refer to section c of FIG. 1A. The contact liner and contact metal 610 were etched back using a $SF_6$-based plasma, to obtain a contact 600 with a targeted thickness (e.g., the thickness of TiN+W over the source/drain region) of 10 nm.

We now refer to section d of FIG. 1A. The trench 400 was overfilled with a sacrificial material 700 comprising a Lewis basic functional group, such as a spin-on-carbon (SoC) or poly(methyl methacrylate) (PMMA).

Figure 1B:
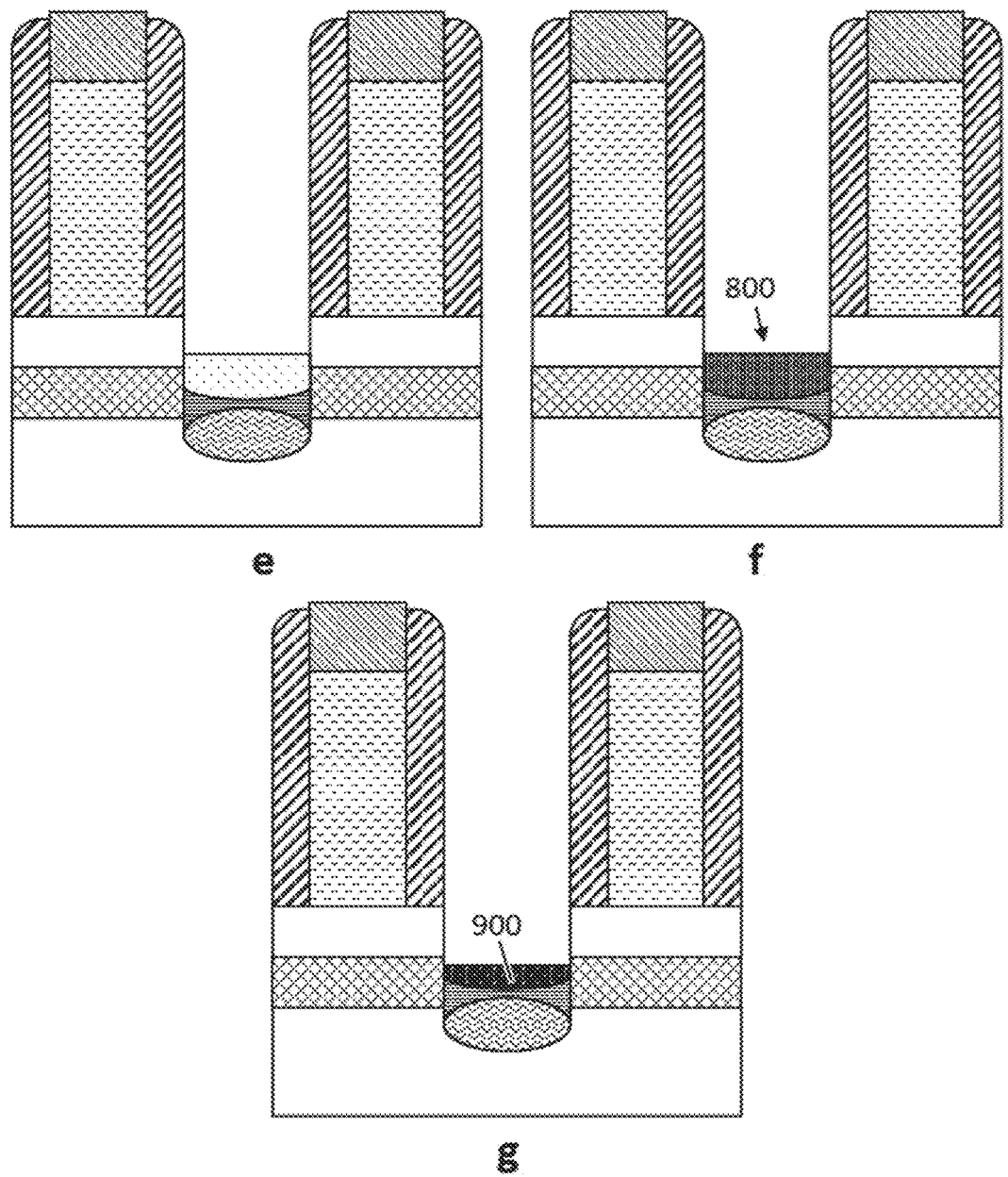
FIG. 1B depicts steps in a process of forming a contact isolation for a semiconductor device in accordance with an example embodiment of the present disclosure.

We now refer to section e of FIG. 1B. The sacrificial material 700 was etched back using a $H_2$/He-based plasma; the latter providing a relatively slow etching which allows to tightly control the depth of the etch-back and thus the amount of sacrificial material 700 remaining in the trench 400. For instance, the etch-back rate of SoC was lower than 1 nm/s (about eight to ten times slower as compared to using a standard $O_2$-based plasma).

We now refer to section f of FIG. 1B. The sacrificial material 700 was infiltrated with a ceramic material 800 (e.g., selected from $Al_2O_3$, $HfO_2$, $ZrO_2$, $TiO_x$, $RuO_x$ or $SiO_2$), using a sequential infiltration synthesis based on a first precursor (e.g., a Lewis acidic metal compound, cf. supra) and a second precursor (e.g., an oxidant; cf. supra). Herein, a non-metal oxide (e.g., $SiO_2$) may be utilized to minimize the contamination risk.

We now refer to section f of FIG. 1B. The sacrificial material 700 was removed using an $O_2$-based plasma treatment, thereby leaving the ceramic material as contact isolation 900 with a shrunken thickness of about 10 nm.

It is to be understood that although example embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a contact isolation for a semiconductor device, comprising:
    providing a semiconductor structure comprising a trench exposing a contact thereunder, the trench penetrating a semiconductor region comprising Si and an auxiliary region comprising SiGe;
    filling a bottom of the trench with a sacrificial material;
    infiltrating the sacrificial material with a ceramic material; and
    removing the sacrificial material, wherein removing the sacrificial material comprises an $O_2$-based plasma etching.

2. The method according to claim 1, wherein the sacrificial material comprises a Lewis basic functional group.

3. The method according to claim 1, wherein filling the bottom of the trench with the sacrificial material comprises filling the bottom of the trench with carbon via a spin-on process.

4. The method according to claim 1, wherein the ceramic material is an oxide of Zr, Ru, or Si.

5. The method according to claim 1, wherein the ceramic material has a relative dielectric constant of 15 or less.

6. The method according to claim 1, wherein infiltrating the sacrificial material with the ceramic material comprises:
    exposing the sacrificial material to a first precursor; and
    exposing the sacrificial material to a second precursor.

7. The method according to claim 6, wherein the first precursor is a Lewis acidic metal compound and wherein the second precursor is an oxidant.

8. The method according to claim 1, wherein infiltrating the sacrificial material with the ceramic material comprises a sequential infiltration synthesis.

9. The method according to claim 1, further comprising:
growing a further ceramic material on the ceramic material.

10. The method according to claim 1, wherein filling the bottom of the trench with the sacrificial material comprises:
filling the trench with the sacrificial material, and
etching back the sacrificial material.

11. The method according to claim 10, wherein etching back the sacrificial material comprises an $H_2$/He-based plasma etching.

12. The method according to claim 1, wherein the semiconductor device is a complementary field-effect transistor.

13. The method according to claim 1, wherein the contact isolation has a thickness of 20 nm or less.

14. The method according to claim 1, wherein the sacrificial material is a polymethyl methacrylate.

15. The method according to claim 1, wherein the ceramic material is an oxide of Al, Hf, or Ti.

16. The method according to claim 1, wherein providing the semiconductor structure comprises providing the semiconductor structure such that the trench separates gate spacers of two adjacent gate lines.

17. The method according to claim 1, wherein providing the semiconductor structure comprises providing the semiconductor structure such that the trench exposes a p-SiGe source/drain region.

18. The method according to claim 17, wherein the p-SiGe source/drain region is epitaxial.

19. The method according to claim 17, wherein the p-SiGe source/drain region is boron-doped.

* * * * *